(12) United States Patent
Chenakin et al.

(10) Patent No.: US 9,628,066 B1
(45) Date of Patent: Apr. 18, 2017

(54) FAST SWITCHING, LOW PHASE NOISE FREQUENCY SYNTHESIZER

(71) Applicants: Oleksandr Chenakin, San Jose, CA (US); Syama Nediyanchath, Morgan Hill, CA (US)

(72) Inventors: Oleksandr Chenakin, San Jose, CA (US); Syama Nediyanchath, Morgan Hill, CA (US)

(*) Notice: Subject to any disclaimer, the term of this patent is extended or adjusted under 35 U.S.C. 154(b) by 0 days.

(21) Appl. No.: 15/260,258

(22) Filed: Sep. 8, 2016

Related U.S. Application Data

(60) Provisional application No. 62/284,115, filed on Sep. 19, 2015.

(51) Int. Cl.
| | |
|---|---|
| *H03L 7/06* | (2006.01) |
| *H03K 17/04* | (2006.01) |
| *H03L 7/099* | (2006.01) |
| *H03L 7/18* | (2006.01) |

(52) U.S. Cl.
CPC ............ *H03K 17/04* (2013.01); *H03L 7/099* (2013.01); *H03L 7/18* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 4,105,949 A | 8/1978 | Hardin | |
| 4,604,583 A | 8/1986 | Aoyagi et al. | |
| 5,281,863 A * | 1/1994 | Bond | H03L 7/183 327/105 |
| 5,508,661 A | 4/1996 | Keane et al. | |
| 5,770,977 A | 6/1998 | Uurtamo | |
| 6,188,740 B1 | 2/2001 | Tomaru | |
| 6,282,249 B1 | 8/2001 | Tomesen et al. | |
| 6,373,344 B1 | 4/2002 | Mar | |
| 6,480,006 B1 | 11/2002 | Buckley | |
| 6,765,977 B1 | 7/2004 | Adams et al. | |
| 6,931,243 B2 * | 8/2005 | Goldman | H03L 7/23 455/183.1 |
| 6,992,531 B2 | 1/2006 | Mar | |
| 7,012,453 B2 | 3/2006 | Coleman et al. | |
| 7,023,249 B1 | 4/2006 | Mulbrook | |
| 7,209,936 B2 | 4/2007 | Sullivan | |
| 7,321,268 B2 * | 1/2008 | Chang | H03B 21/02 331/25 |

(Continued)

OTHER PUBLICATIONS

Gao et al., "A Low Noise Sub-Sampling PLL in Which Divider Noise is Eliminated and PD/CP Noise is Not Multiplied N squared", IEEE J. Solid State Circuits, v. 44, p. 3253, Dec. 2009.

(Continued)

*Primary Examiner* — Adam Houston

(57) ABSTRACT

A low phase noise PLL synthesizer is described in which an initial tuning mechanism uses a conventional divider loop to lock a VCO to a desired output frequency. Once initial lock is achieved, the divider loop is switched out of the circuit in favor of a low phase noise mixer loop. The reference frequency source for the low phase noise loop includes a mixer/divider up-conversion chain at the output of a direct digital synthesizer. This permits fine frequency resolution from the DDS but maintains a high phase detector comparison frequency and therefore fast frequency switching speed.

10 Claims, 6 Drawing Sheets

(56) References Cited

U.S. PATENT DOCUMENTS

| | | | |
|---|---|---|---|
| 7,369,002 B2 | 5/2008 | Spijker et al. | |
| 7,386,286 B2* | 6/2008 | Petrovic | H03D 3/007 |
| | | | 329/323 |
| 7,701,299 B2 | 4/2010 | Chenakin | |
| 8,373,463 B1* | 2/2013 | Chenakin | H03L 7/095 |
| | | | 327/147 |
| 2002/0196061 A1* | 12/2002 | Atyunin | H03K 5/135 |
| | | | 327/158 |
| 2007/0046347 A1* | 3/2007 | Lee | H03L 7/0814 |
| | | | 327/158 |
| 2008/0136535 A1 | 6/2008 | Khorram | |
| 2008/0157881 A1 | 7/2008 | Dent et al. | |
| 2009/0146708 A1* | 6/2009 | Yun | H03L 7/07 |
| | | | 327/158 |
| 2009/0309665 A1* | 12/2009 | Chenakin | H03L 7/16 |
| | | | 331/25 |

OTHER PUBLICATIONS

Chiu et al., "A Dynamic Phase Error Compensation Technique for Fast-Locking Phase-Locked Loops", IEEE J. Solid State Circuits, v. 45, p. 1137, Jun. 2010.

\* cited by examiner

FAST SWITCHING, LOW PHASE NOISE FREQUENCY SYNTHESIZER

RELATED APPLICATIONS

This application claims priority benefit from U.S. Provisional Patent Application No. 62/284,115, filed on Sep. 19, 2015 and incorporated herein by reference.

TECHNICAL FIELD

The disclosure is related to phase-locked-loop (PLL) synthesizers and direct analog frequency synthesizers.

BACKGROUND

A frequency synthesizer is an electronic system that translates an input reference frequency signal to an output signal at a different frequency. Specifications such as output frequency range, step size, phase noise, spurious signal levels, and switching speed are important synthesizer characteristics. Trade-offs exist between many different design parameters. As just one example, switching speed, i.e. how fast the output frequency can be changed, may have to be sacrificed to reduce step size and/or phase noise.

FIG. 1 is a simplified block diagram for a conventional PLL frequency synthesizer. The circuit is based on a voltage controlled oscillator (VCO) whose frequency output is locked in relation to a reference frequency by a feedback loop. In the figure, voltage controlled oscillator 125 generates an output signal 135 at frequency f. A portion of this signal is fed back to phase detector 110 via power splitter 130 and frequency divider 140. The frequency divider has a division ratio of N, meaning that its output frequency is N times less than its input frequency. The other input to the phase detector is a reference frequency signal 105 $F_{REF}$ which may be generated by a high-stability, fixed-frequency oscillator, for example. The phase detector compares the two signals at its inputs and generates an error signal which is then fed through low-pass loop filter 115 and amplifier 120 before reaching the voltage controlled oscillator. (The phase detector, low pass filter, amplifier, VCO, power splitter and frequency divider therefore form a loop circuit.) The filtered and amplified error signal changes the frequency of the VCO until f is locked in relation to $F_{REF}$ by: $f=F_{REF} \times N$. If frequency divider 140 is programmable, as is often the case, the synthesizer can be programmed to generate any one of many frequencies within a range determined by the VCO. The step size between the possible output frequencies is equal to the reference frequency $F_{REF}$.

Phase noise is a manifestation of instability of the output frequency of a PLL synthesizer and is observed as random frequency fluctuations around the desired output frequency. It is a limiting factor in the sensitivity of radio frequency receivers. The level of phase noise near the desired carrier frequency depends on phase noise in the reference signal and on the PLL synthesizer circuit design.

Synthesizer phase noise within the loop filter bandwidth is given by $\lambda=\lambda_{PD}+20 \log N$ where $\lambda_{PD}$ is the cumulative phase noise of the reference signal, phase detector, feedback divider, loop filter and amplifier referred to the phase detector input, and N is the division ratio of the frequency divider. In practice, the synthesizer phase noise performance is usually limited by large division ratios required to provide high-frequency output with fine resolution. For example, to obtain 1 MHz frequency resolution at 10 GHz output, the feedback divider ratio is 10,000, corresponding to 80 dB phase noise degradation.

At high frequencies an additional fixed divider (pre-scaler) may be needed as programmable dividers are often limited to lower frequency operation. This increases the total division ratio by the pre-scaler division ratio resulting in further phase noise degradation. (The amplitudes of spurious signals at multiples of the reference frequency also tend to be proportional to N.)

FIG. 2 is a simplified block diagram for a conventional PLL frequency synthesizer with frequency conversion in the synthesizer feedback loop. The circuit shown in FIG. 2 represents a conventional approach to phase noise reduction in PLL synthesizers based on reducing the frequency division ratio in the feedback loop. In the figure, voltage controlled oscillator (VCO) 225 generates an output signal 235 at frequency f. A portion of this signal is fed back to phase detector 210 via power splitter 230, mixer 250, and frequency divider 240. The other input to the phase detector is a reference frequency signal 205 $F_{REF}$ which may be generated by a high-stability, fixed-frequency oscillator, for example. A digital-to-analog converter (DAC) 260 is provided to translate digital tuning commands 255 for coarse tuning.

Mixer 250 reduces the maximum frequency division ratio by mixing the VCO output frequency with offset frequency $f_1$. Therefore, when the PLL synthesizer of FIG. 2 is locked, $f=f_1 \pm f_{REF} \times N$. Offset frequency $f_1$ may be obtained from another phase-locked loop or frequency multiplier.

Circuits of the type shown in FIG. 2 sometimes suffer from false lock to spurious mixer products. For example, the PLL might lock to the wrong sideband, harmonics, intermodulation products or leakage of the local oscillator. An accurate coarse-tuning mechanism is required to avoid false lock problems. In FIG. 2, DAC 260 tunes VCO 225 to approximately the correct frequency before the phase-locked loop locks. For such a coarse tuning system to work well, the tuning characteristics of the VCO must be linear and repeatable. Precise calibration is required to compensate for VCO temperature drift. DAC's are usually noisy and adversely affect synthesizer phase noise performance if they are not properly removed from the circuit after initial frequency acquisition.

Further, in the design of FIG. 2, mixer harmonic and intermodulation products can fall within the synthesizer loop bandwidth as shown in FIG. 3. FIG. 3 shows a spurious mixer product within the low pass filter response of the loop filter. Fractional-N and direct digital synthesis architectures can have similar problems with elevated spur levels.

Another method for generating a high-frequency signal with low phase noise and low spurious characteristics is described in U.S. Pat. No. 7,701,299, incorporated herein by reference. The design of this PLL synthesizer includes a simple, reliable and exact initial tuning mechanism which does not suffer from component instabilities. See FIG. 4. The synthesizer has good suppression of spurious signals because undesired mixer products fall outside the loop bandwidth. Low phase noise performance is achieved by removing frequency dividers from the synthesizer loop.

The initial tuning mechanism in the PLL synthesizer uses a conventional divider loop to lock a VCO to a desired output frequency. Once initial lock is achieved, the divider loop is switched out of the circuit in favor of a low phase noise mixer loop. The design of the mixer loop ensures that spurious signals fall outside the bandwidth of the PLL low pass filter and are therefore easily removed.

FIG. 4 is a simplified block diagram of a low phase noise PLL synthesizer. The circuit is based on a VCO that is locked in relationship to a reference frequency by either of two feedback loops. One loop is used for initial tuning, while another provides low phase noise performance by removing all frequency dividers from the loop.

In the figure, an error signal generated by phase detector 410 is filtered by low-pass filter 415 and amplified by amplifier 420 before feeding voltage controlled oscillator (VCO) 425. A portion of the VCO output signal 435 is split off by power splitter 430 and returned to the phase detector after passing through either of two branches of a feedback loop selected by a switch.

Switch 460 selects either a conventional frequency divider loop similar to that shown in FIG. 1 or a frequency mixer system. A conventional loop comprising divider 440 is selected when switch 460 is in position "1" and is used for initial tuning. This loop includes components in the signal path between signals 463 and 462. A mixer system is selected when switch 460 is in position "2" and is used to achieve low phase noise operation. This loop includes components in the signal path between signals 461 and 464.

In FIG. 4, the mixer system selected by position "2" of switch 460 is illustrated in generalized form. The mixer system comprises: mixers, such as mixers 470, 471, 477 and 478; frequency multipliers, such as multipliers 480, 481, 487 and 488; and frequency dividers, such as dividers 490, 491, 497 and 498. Each mixer has a corresponding multiplier and divider; however, the number of mixers used in a particular system may be one, two, several, or even as many as ten or more. For this reason, FIG. 4 shows mixers denoted $M_1$ through $M_i$ with corresponding multipliers $C_1$ through $C_i$ and dividers $D_1$ through $D_i$. Dotted lines 455 indicate that mixers with corresponding multipliers and dividers may be included in, or removed from, the circuit while maintaining the same architecture and principle of operation. The multipliers' multiplication factors ($C_1$ through $C_i$) and the dividers' division ratios ($D_1$ through $D_i$) are integers. The multipliers may be comb generators which output a large number of harmonics.

Reference frequency $F_{REF}$ 405 is a high-stability, low phase noise reference signal. $F_{REF}$ is divided by dividers $D_1$ through $D_i$ to form phase detector comparison signal 468 ($F_0$) which is one input to phase detector 410. The phase detector compares $F_0$ with signal 466. Note that dividers 490, 491, 497 and 498, providing division ratios ($D_1$ through $D_i$), are not in the PLL feedback loop and are not in the signal path between signals 461 and 464. When switch 460 is in position "2" the VCO clews to a lock frequency given by $f=F_0(D_1D_2 \ldots D_{i-1}D_iC_i \pm D_1D_2 \ldots D_{i-1}C_{i-1} \pm \ldots \pm D_1D_2C_2 \pm D_1C_1 \pm 1)$. Since all the division and multiplication coefficients are integers, $f=F_0 \times N$, where $N=(D_1D_2 \ldots D_{i-1}D_iC_i \pm D_1D_2 \ldots D_{i-1}C_{i-1} \pm \ldots \pm D_1D_2C_2 \pm D_1C_1 \pm 1)$ is an integer.

Possible frequencies output by the synthesizer of FIG. 4 are equally spaced by $F_0$ as shown in FIG. 5. Switch 460 is set to position "1" to initially tune the synthesizer to one of the frequencies using a conventional divider feedback loop. A desired output frequency can be chosen exactly since divider 440 causes the feedback loop to lock to $f=F_0 \times N$ where N is the division ratio of the divider and N may be chosen to exactly match an output of the mixer branch where $N=(D_1D_2 \ldots D_{i-1}D_iC_i \pm D_1D_2 \ldots D_{i-1}C_{i-1} \pm \ldots \pm D_1D_2C_2 \pm D_1C_1 \pm 1)$. This design minimizes the chance of false lock; i.e. locking the loop to an incorrect frequency.

In the design of FIG. 4, the mixer branch does not generate undesired signal products within the synthesizer loop bandwidth. The output of each mixer includes a large number of products including the mixer RF and LO fundamental frequencies, their harmonics, the sums and differences of the RF and LO frequencies, and their harmonics given by $f_{MIX}=\pm mf_{RF} \pm nf_{LO}$ which may be written as $f_{MIXi}=\pm mF_0 N \pm nF_0 D_1 D_2 \ldots D_{i-1} D_i C_i$ for mixer $M_i$. Assuming that all the coefficients are integers, the mixer products can be expressed as $f_{MIXi}=kF_0$ where k is an integer. Similarly, all harmonic and intermodulation products generated by the mixer branch are multiples of the phase detector comparison frequency $F_0$. These products are easily rejected by a loop low-pass filter. The loop filter bandwidth is made small enough to reject undesired signals, typically ten times less than $F_0$. The output of the PLL is therefore a desired frequency, f, within an effective band pass filter having a width narrower than $F_0$. This design ensures that spurious mixer products fall outside the loop filter bandwidth and are therefore easily removed.

Given a desired output frequency f and frequency resolution or step size $F_0$, the operation of the synthesizer proceeds as follows: Switch 460 is set to position "1" so that the initial-tuning divider branch is connected to, and the mixer branch is disconnected from, the phase detector. The divider ratio, N, of divider 440 is programmed to equal the ratio between the desired output frequency f and the step size $F_0$. The phase detector generates an error signal that tunes the VCO output to f. The phase detector also generates a lock-detect signal that switches switch 460 to position "2", thereby removing the divider branch from, and including the mixer branch in, the loop circuit. VCO output f is converted in the mixer branch to frequency $F_0$, the same frequency that was generated earlier in the divider branch. The phase detector relocks the output signal f; however, this time there is no frequency division in the feedback loop and phase noise is reduced. Loop low-pass filter 415 removes undesired mixer products thereby ensuring low spurious emissions.

The design of FIG. 4 offers: (1) a simple, reliable and exact coarse-tuning mechanism which does not depend on component instabilities, (2) low spurious signals due to the absence of undesired products within the loop bandwidth, and (3) low phase noise due to removing frequency dividers from the synthesizer loop.

However, in the design of FIG. 4 the frequency step size $F_0$ is limited by the PLL loop filter bandwidth and cannot be arbitrarily small. Reducing $F_0$ leads to smaller PLL loop filter bandwidth and slower switching speed. Thus, there is an inherent trade-off between frequency resolution and switching speed in the design of FIG. 4.

The time spent by a synthesizer transitioning between frequencies is wasted since it cannot be used for data processing. What is needed is a frequency synthesizer that is capable of generating high frequency signals with low phase noise and low spurious signals, yet also has fine frequency resolution and fast switching speed.

DETAILED DESCRIPTION

Figure 6:
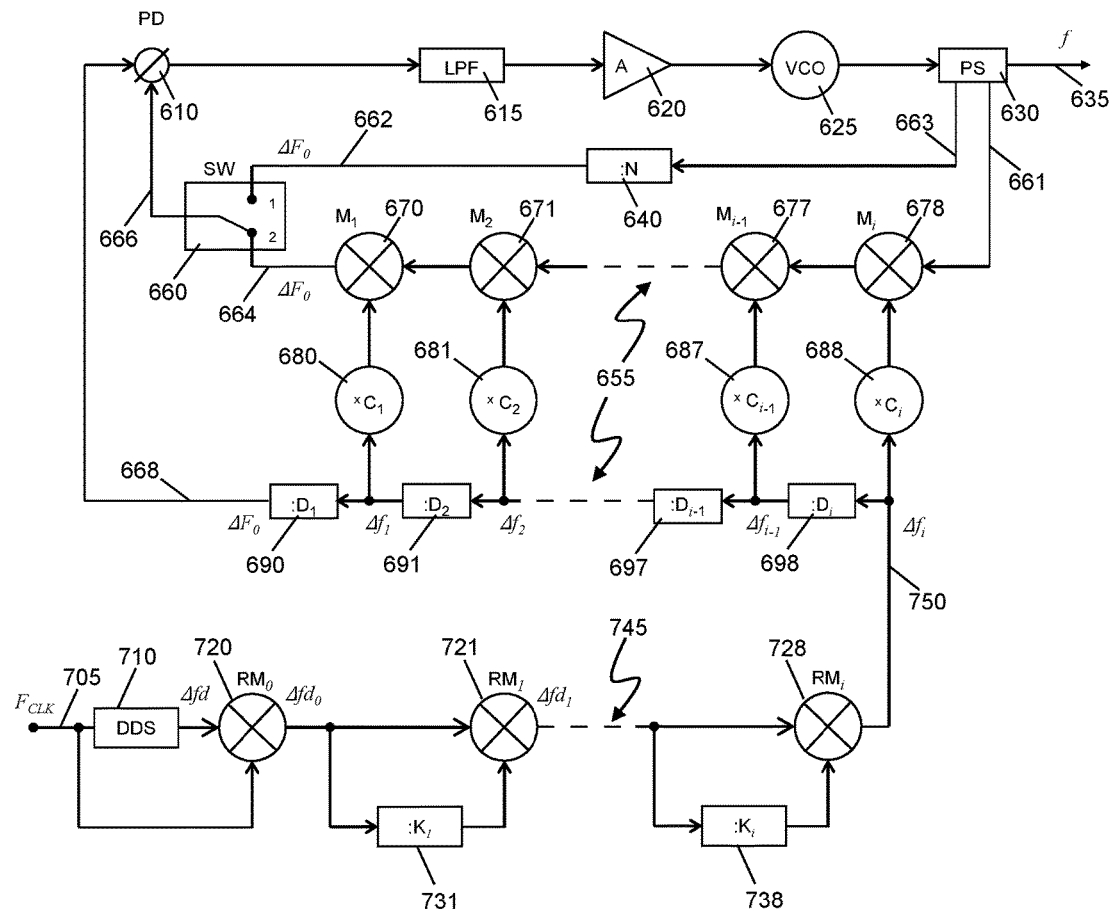
FIG. 6 is a simplified block diagram of a frequency synthesizer that has fine frequency resolution and fast switching speed.

The tradeoff between fine frequency resolution and fast switching speed that exists in prior-art synthesizers is removed in a new synthesizer design. FIG. 6 is a simplified block diagram of a frequency synthesizer that has fine frequency resolution and fast switching speed as well as low phase noise and low spurious signals.

Figure 4:
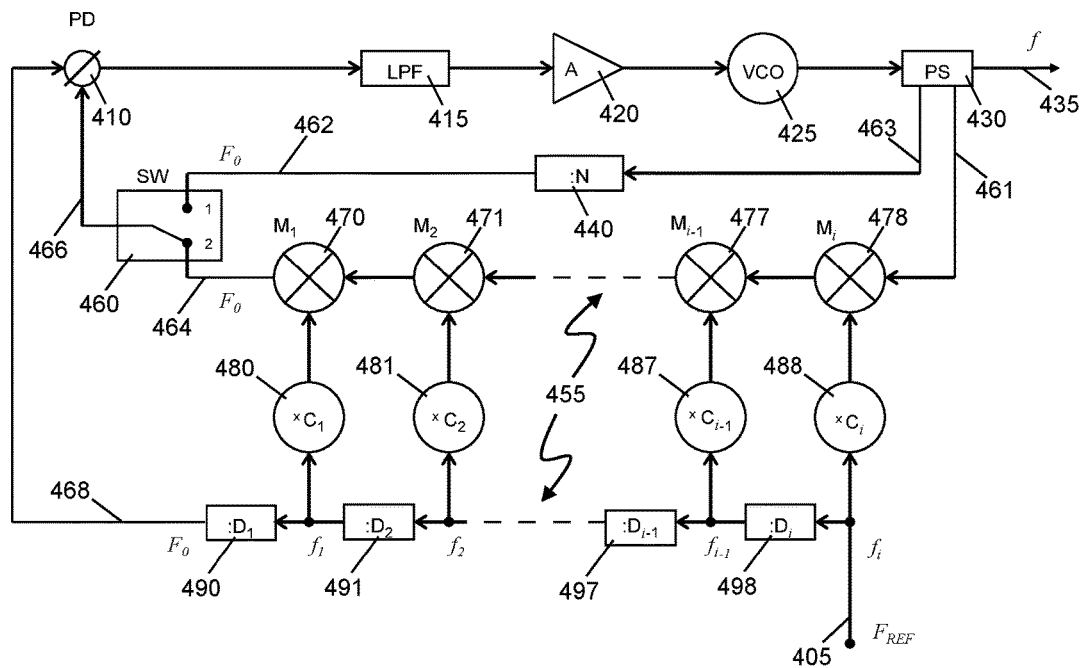
FIG. 4 is a simplified block diagram for a conventional synthesizer with multiple frequency conversions in the synthesizer feedback loop.
Figure 5:
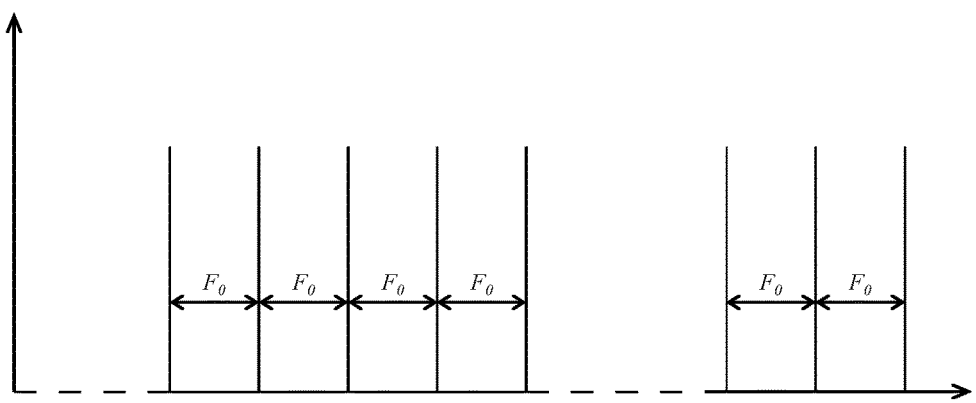
FIG. 5 shows output frequencies generated by a conventional synthesizer with multiple frequency conversions in the synthesizer feedback loop.

The synthesizer of FIG. 6 is different from that of FIG. 4 because reference frequency 405 is replaced by a direct digital synthesizer (DDS) and an up-conversion mixer/divider chain. A DDS provides fine frequency resolution, but it is not satisfactory to replace reference frequency 405 by a DDS alone because that would lead to multiplication of DDS spurious signals. Instead a novel, up-conversion mixer/divider chain translates the DDS's small step size to higher frequencies without losing relative bandwidth and without worsening the DDS's phase noise or spurious signal characteristics. Programmable division coefficients $K_i$ may be chosen to increase the bandwidth of the DDS signal as much as desired.

Components in FIG. 6 that are identified with reference numbers in the 600's correspond directly to components in FIG. 4 that are identified with reference numbers in the 400's. New components in FIG. 6 are identified with reference numbers in the 700's. "ΔF" notation replaces "F" notation in many cases. As explained in greater detail below, ΔF means that F lies within a bandwidth range between some minimum and some maximum frequency.

In FIG. 6, an error signal generated by phase detector 610 is filtered by low-pass filter 615 and amplified by amplifier 620 before feeding voltage controlled oscillator (VCO) 625. A portion of the VCO output signal 635 is split off by power splitter 630 and returned to the phase detector after passing through either of two branches of a feedback loop selected by a switch.

Figure 1:
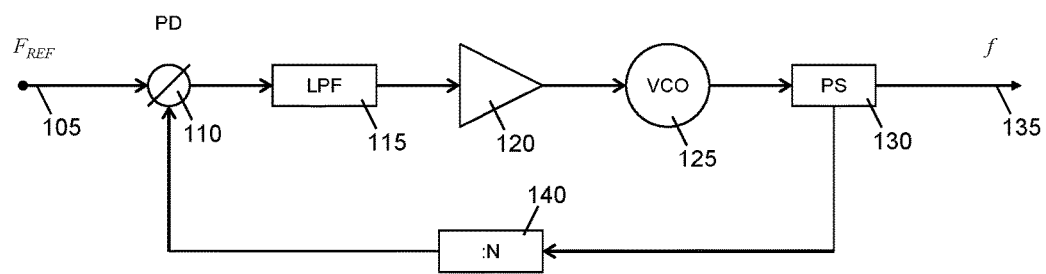
FIG. 1 is a simplified block diagram of a conventional PLL synthesizer.
Figure 2:
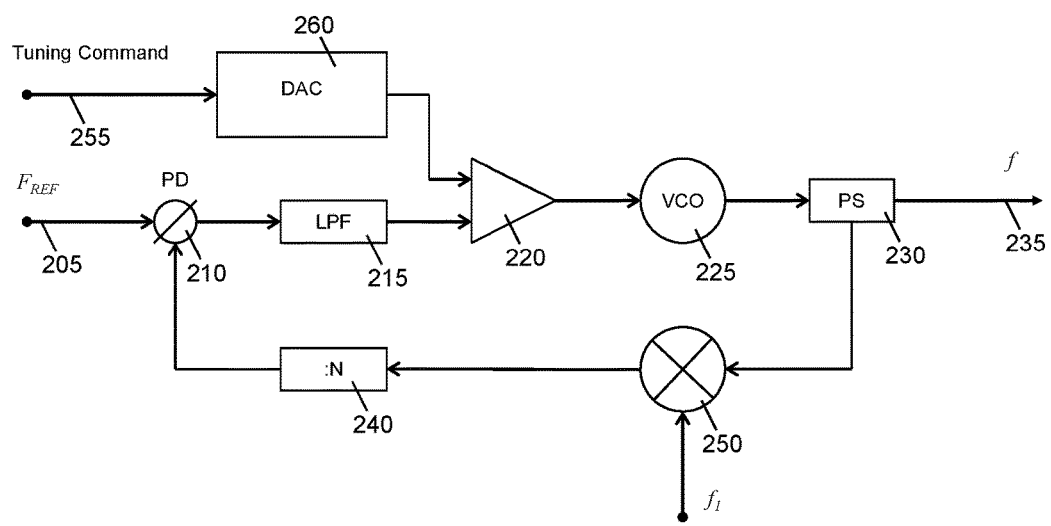
FIG. 2 is a simplified block diagram of a conventional PLL frequency synthesizer with frequency conversion in the synthesizer feedback path.
Figure 3:
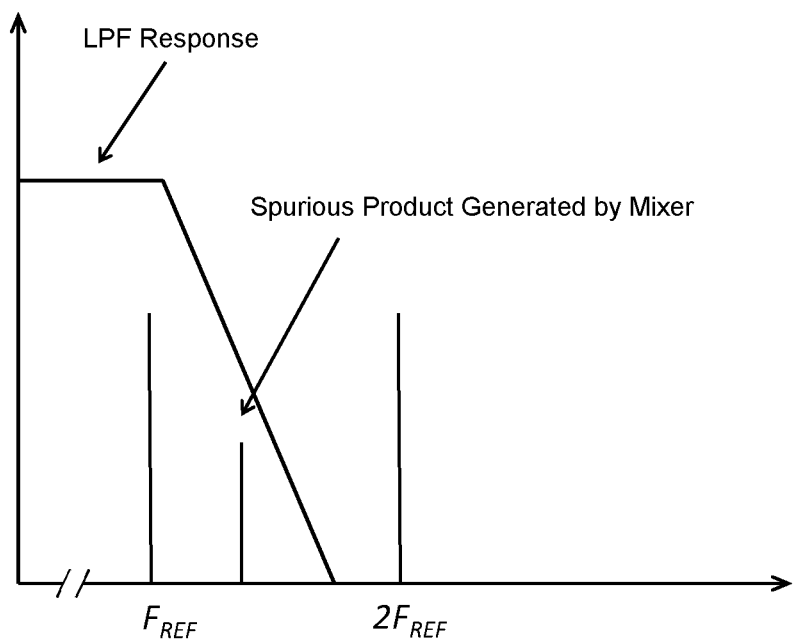
FIG. 3 is a graph showing how spurious signals can fall within the loop bandwidth of a conventional PLL synthesizer employing frequency conversion.

Switch 660 selects either a conventional frequency divider loop similar to that shown in FIG. 1 or a frequency mixer system. A conventional loop comprising divider 640 is selected when switch 660 is in position "1" and is used for initial tuning. This loop includes components in the signal path between signals 663 and 662. A mixer system, and a frequency reference based on a DDS and up-conversion mixer chain, is selected when switch 660 is in position "2". This loop includes components in the signal path between signals 661 and 664.

In FIG. 6, the mixer system selected by position "2" of switch 660 is illustrated in generalized form. The mixer system comprises: mixers, such as mixers 670, 671, 677 and 678; frequency multipliers, such as multipliers 680, 681, 687 and 688; and frequency dividers, such as dividers 690, 691, 697 and 698. Each mixer has a corresponding multiplier and divider; however, the number of mixers used in a particular system may be one, two, several, or even as many as ten or more. For this reason, FIG. 6 shows mixers denoted $M_1$ through $M_i$ with corresponding multipliers $C_1$ through $C_i$ and dividers $D_1$ through $D_i$. Dotted lines 655 indicate that mixers with corresponding multipliers and dividers may be included in, or removed from, the circuit while maintaining the same architecture and principle of operation. The multipliers' multiplication factors ($C_1$ through $C_i$) and the dividers' division ratios ($D_1$ through $D_i$) are integers. The multipliers may be comb generators which output a large number of harmonics.

Signal $\Delta f_i$ 750 is the output of a DDS and up-conversion mixer/divider chain. It is divided by dividers $D_1$ through $D_i$ to form phase detector comparison signal 668 ($\Delta F_0$) which is one input to phase detector 610. The phase detector compares $\Delta F_0$ with signal 666. Note that dividers 690, 691, 697 and 698, providing division ratios ($D_1$ through $D_i$), are not in the PLL feedback loop and are not in the signal path between signals 661 and 664. When switch 660 is in position "2" the VCO clews to a lock frequency given by $f=\Delta F_0(D_1D_2 \ldots D_{i-1}D_iC_i \pm D_1D_2 \ldots D_{i-1}C_{i-1} \pm \ldots \pm D_1D_2C_2 \pm D_1C_1 \pm 1)$. Since all the division and multiplication coefficients are integers, $f=\Delta F_0 \times N$, where $N=(D_1D_2 \ldots D_{i-1}D_iC_i \pm D_1D_2 \ldots D_{i-1}C_{i-1} \pm \ldots \pm D_1D_2C_2 \pm D_1C_1 \pm 1)$ is an integer.

Switch 660 is set to position "1" to initially tune the synthesizer to one of the frequencies using a conventional divider feedback loop. A desired output frequency can be chosen exactly since divider 640 causes the feedback loop to lock to $f=\Delta F_0 \times N$ where N is the division ratio of the divider and N may be chosen to exactly match an output of the mixer branch where $N=(D_1D_2 \ldots D_{i-1}D_iC_i \pm D_1D_2 \ldots D_{i-1}C_{i-1} \pm \ldots \pm D_1D_2C_2 \pm D_1C_1 \pm 1)$. This design minimizes the chance of false lock; i.e. locking the loop to an incorrect frequency.

In the design of FIG. 6, the mixer branch (670 . . . 678) does not generate undesired signal products within the synthesizer loop bandwidth. The output of each mixer includes a large number of products including the mixer RF and LO fundamental frequencies, their harmonics, the sums and differences of the RF and LO frequencies, and their harmonics given by $f_{MIX}=\pm mf_{RF} \pm nf_{LO}$ which may be written as $f_{MIXi}=\pm m\Delta F_0 N \pm n\Delta F_0 D_1D_2 \ldots D_{i-1}D_iC_i$ for mixer $M_i$. Assuming that all the coefficients are integers, the mixer products can be expressed as $f_{MIXi}=k\Delta F_0$ where k is an integer. Similarly, all harmonic and intermodulation products generated by the mixer branch are multiples of the phase detector comparison frequency $\Delta F_0$. These products are easily rejected by a loop low-pass filter. The loop filter bandwidth is made small enough to reject undesired signals, typically ten times less than $\Delta F_0$. The output of the PLL is therefore a desired frequency, f, within an effective band pass filter having a width narrower than $\Delta F_0$. This design ensures that spurious mixer products fall outside the loop filter bandwidth and are therefore easily removed.

Operation of the synthesizer proceeds as follows: Switch 460 is set to position "1" so that the initial-tuning divider branch is connected to, and the mixer branch is disconnected from, the phase detector. The divider ratio, N, of divider 440 is programmed to equal the ratio between the desired output frequency f and the step size $\Delta F_0$. (Again, $\Delta F_0$ means a frequency that lies within a bandwidth range as explained below.) The phase detector generates an error signal that tunes the VCO output to f. The phase detector also generates a lock-detect signal that switches switch 460 to position "2", thereby removing the divider branch from, and including the mixer branch in, the loop circuit. VCO output f is converted in the mixer branch to frequency $\Delta F_0$, the same frequency that was generated earlier in the divider branch. The phase detector relocks the output signal f; however, this time there is no frequency division in the feedback loop and phase noise is reduced. Loop low-pass filter 615 removes undesired mixer products thereby ensuring low spurious emissions.

In FIG. 6, clock frequency signal $F_{CLK}$ 705 is input to DDS 710 and also serves as the LO signal for mixer 720, $RM_0$. ($F_{CLK}$ may be a stable reference frequency multiplied by a multiplier, for example, or another clock source.) The output of DDS 710 has a frequency that lies within bandwidth $\Delta fd$. The output of mixer $RM_0$ lies within bandwidth $\Delta fd_0$ and this signal is the input to mixer 721, $RM_1$. The same signal is also the input to divider 731 which has an integer division ratio $K_1$. The output of mixer $RM_1$ lies within bandwidth $\Delta fd_1$ and this signal is the input to the next mixer and divider in a chain. Mixer 728 ($RM_i$) and divider 738 (integer division ratio $K_i$) are the last mixer and divider in the chain. Dashed line 745 indicates that there may be more mixer/divider pairs in the chain. The number of mixer/divider pairs used in a particular system may be one, two, several, or even as many as ten or more. Mixer/divider pairs may be included in, or removed from, the circuit while maintaining the same architecture and principle of operation. At the end of the mixer/divider chain, output signal 750 lies within bandwidth $\Delta f_i$.

Division coefficients $K_i$ are selected so that the output of the mixer/divider chain may lie anywhere within a continuous bandwidth $\Delta f_i$ where $\Delta f_i > \Delta fd_{i-1} > \ldots > \Delta fd_1 > \Delta fd_0$. Frequency steps within the selected bandwidth may be as small as the step size of the DDS permits. As an example, suppose the input frequency to one mixer/divider pair lies within a bandwidth $\Delta f$ from 4 to 6 MHz. The relative bandwidth is 33% ((6 MHz−4 MHz)/6 MHz). If the division ratio K=2, then the output bandwidth is from 2 to 3 MHz. If the division ratio K=3, then the output bandwidth is from 1.33 to 2 MHz. By programming the division ratio K to either 2 or 3 as desired, the total bandwidth available now extends from 1.33 to 3 MHz. The total relative bandwidth is now 55% ((3 MHz−1.33 MHz)/3 MHz). In an actual synthesizer of the design of FIG. 6, the mixer/divider chain (721 . . . 728) with programmable division ratios (731 . . . 738) allows signals to be generated in a wide, continuous bandwidth that is greater than the usable DDS bandwidth. (Part of the DDS bandwidth is not usable because of (1) undesired close-in mixer sidebands and (2) DDS spurs.)

The DDS and up-conversion mixer/divider chain permit frequency steps within bandwidth $\Delta f_i$ that are limited only by DDS resolution and can therefore be very small. At the same time, however, the phase detector comparison frequency within $\Delta F_0$ may still be a high frequency. This design maintains large loop bandwidth and, therefore, fast switching speed from one frequency to another.

The up-conversion mixer/divider chain avoids reductions in relative bandwidth that would occur in an up-conversion-only scheme. The up-conversion mixer/divider chain also preserves spurious signal and phase noise characteristics of the DDS that would be degraded if the DDS output were simply multiplied.

The above description of the disclosed embodiments is provided to enable any person skilled in the art to make or use the invention. Various modifications to these embodiments will be readily apparent to those skilled in the art, and the principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. A frequency synthesizer comprising:
   a phase detector;
   a low pass filter connected to the phase detector;
   an amplifier connected to the low pass filter;
   a voltage controlled oscillator (VCO) connected to the amplifier;
   a power splitter connected to the VCO;
   a switch that selects either a first or second branch that connects the power splitter to the phase detector, wherein, the first branch comprises a first frequency divider and the second branch comprises a mixer and the phase detector generates a lock detect signal that causes the switch to select the second branch after phase lock is achieved by the first branch;
   a direct digital synthesizer (DDS) and up-conversion mixer/divider chain;
   a second frequency divider that divides the output of the DDS and up-conversion mixer/divider chain to generate a phase comparison signal for the phase detector; and,
   a first frequency multiplier that multiplies the output of the DDS and up-conversion mixer/divider chain to generate a local oscillator signal for the mixer.

2. The synthesizer of claim 1 wherein the second branch does not include a frequency divider.

3. The synthesizer of claim 1 wherein the second branch includes a second frequency multiplier.

4. The synthesizer of claim 1 wherein the division ratio of the first frequency divider (that divides the output of the DDS and up-conversion mixer/divider chain) and the multiplication factor of the first frequency multiplier (that multiplies the output of the DDS and up-conversion mixer/divider chain) are integers.

5. The synthesizer of claim 4 wherein the integers are chosen such that the frequency of the output of the second branch matches that of the output of the first branch.

6. The synthesizer of claim 4 further comprising one or more additional mixers in the second branch.

7. The synthesizer of claim 6 further comprising one or more additional multipliers that generate local oscillator signals for the one or more additional mixers.

8. The synthesizer of claim 1 wherein the DDS in the DDS and up-conversion mixer/divider chain has a bandwidth, and the up-conversion mixer/divider chain up-converts an output frequency of the DDS to generate a frequency that lies within a bandwidth that is greater than the usable DDS bandwidth.

9. The synthesizer of claim 8 wherein a divider in the DDS and up-conversion mixer/divider chain has a programmable, integer division ratio.

10. A phase-locked loop frequency synthesizer comprising:
   a phase detector; a low pass filter; an amplifier; a voltage controlled oscillator;
   an initial tuning loop comprising a frequency divider;
   a mixer loop not including a frequency divider; and,
   a direct digital synthesizer and up-conversion mixer/divider chain;
   wherein,
   the synthesizer switches between the initial tuning loop for frequency acquisition and the mixer loop for low phase noise performance;

the initial loop and the mixer loop lock the synthesizer to the same frequency; and, the direct digital synthesizer and up-conversion mixer/divider chain provide a fine frequency resolution source for phase comparison in a wide bandwidth.

* * * * *